United States Patent
Estes et al.

(10) Patent No.: US 7,227,761 B2
(45) Date of Patent: Jun. 5, 2007

(54) APPARATUS FOR RESILIENTLY MOUNTING A CIRCUIT BOARD WITHIN A DEVICE HOUSING

(75) Inventors: Larry Glenn Estes, Durham, NC (US); Raymond Gary Octaviano, II, Raleigh, NC (US)

(73) Assignee: Lenovo Singapore Pte, Ltd., Singapore (SG)

( * ) Notice: Subject to any disclaimer, the term of this patent is extended or adjusted under 35 U.S.C. 154(b) by 0 days.

(21) Appl. No.: 10/963,873

(22) Filed: Oct. 13, 2004

(65) Prior Publication Data

US 2006/0077642 A1    Apr. 13, 2006

(51) Int. Cl.
*H05K 7/02* (2006.01)
*H05K 7/04* (2006.01)

(52) U.S. Cl. .............. 361/810; 361/719; 174/138 D

(58) Field of Classification Search .......... 361/810, 361/760, 730, 720, 741, 807, 736, 748; 174/138 G
See application file for complete search history.

(56) References Cited

U.S. PATENT DOCUMENTS

| | | | | |
|---|---|---|---|---|
| 4,420,203 A | * | 12/1983 | Aug et al. | .............. 439/71 |
| 4,929,185 A | * | 5/1990 | Wong et al. | ............. 439/74 |
| 5,107,404 A | * | 4/1992 | Tam | ................... 361/818 |
| 5,443,390 A | * | 8/1995 | Kokkosoulis et al. | ...... 439/76.1 |
| 5,550,712 A | * | 8/1996 | Crockett | .............. 361/752 |
| 5,901,039 A | * | 5/1999 | Dehaine et al. | ......... 361/704 |
| 6,021,041 A | | 2/2000 | Genix et al. | |
| 6,115,259 A | | 9/2000 | Karner | |
| 6,262,887 B1 | * | 7/2001 | Lee | ................... 361/683 |
| 6,275,352 B1 | | 8/2001 | Tadepalli et al. | |
| 6,399,888 B1 | | 6/2002 | Chen | |
| 6,493,233 B1 | * | 12/2002 | De Lorenzo et al. | ...... 361/752 |
| 6,633,489 B2 | | 10/2003 | Callahan et al. | |
| 6,781,055 B2 | * | 8/2004 | Chen | ................... 174/52.1 |
| 2002/0149916 A1 | | 10/2002 | Kurle et al. | |
| 2003/0159819 A1 | | 8/2003 | Lee | |

FOREIGN PATENT DOCUMENTS

JP     5315772     11/1993

\* cited by examiner

*Primary Examiner*—Tuan Dinh
*Assistant Examiner*—Hung S. Bui
(74) *Attorney, Agent, or Firm*—Ronald V. Davidge; Carlos Munoz-Bustamante

(57) ABSTRACT

A circuit board is mounted within a housing in a resilient manner to minimize the introduction of stresses warping the circuit board as the housing is warped or as a circuit board warped during its manufacture is mounted within the housing. The housing includes spaced apart mounting pads between which screw inserts extend as rigid columns through mounting holes within the circuit board. The surfaces of the mounting holes slide on the surfaces of the screw inserts, with the circuit board being resiliently held by resilient pads between its surfaces and the mounting pads.

16 Claims, 1 Drawing Sheet

APPARATUS FOR RESILIENTLY MOUNTING A CIRCUIT BOARD WITHIN A DEVICE HOUSING

BACKGROUND OF THE INVENTION

1. Field of the Invention

This invention relates to the mounting of circuit boards within housings of portable electronic devices and, more particularly, to a method for mounting a system board within a laptop computer to prevent damage to the connections between the board and components mounted thereon due to the warping of the system board.

2. Summary of the Background Art

The system board of a laptop computer includes a number of circuit modules attached to the board by mechanical and electrical connections, such as the solder balls of a ball grid array, that are susceptible to damage by warping the system board in the region of the components. Such warpage may occur due to the warping of the case of the laptop computer, to which the system board is attached, when the laptop computer is jammed into a small space, such as a student's backpack, with other items. Furthermore, damage to such electrical connections may occur when a circuit board warped during its manufacture is forced into a flattened condition as it is rigidly mounted within the case of the laptop computer.

A number of components within computer systems have been mounted by means of resilient materials applied to reduce the effects of shock loads applied to the case of the system on the components, regardless of the directions in which the shock loadings are applied. Such mounting means provides for the deflection of the internal component in any direction relative to the surrounding structures. When such methods are applied to a system board, the resulting resilience of movement in all directions results in an undesirably spongy feel when the user attaches cables to connectors mounted on the circuit board. Furthermore, the allowed movements of the system board by such mounting may result in the misalignment of switches, key buttons, indicator lights, etc., that need to be aligned with features of the cover, such as cutouts. Thus, what is needed is a method for mounting a circuit board to allow motion against resilient surfaces perpendicular to the surfaces of the circuit board while restricting movement of the circuit board in directions parallel to its surfaces.

The covers of portable electronic devices are usually composed to plastic materials because of the low weight and other desirable features of such materials. Because of the difficulties associated with forming satisfactory screw threads in plastic materials, metallic threaded inserts may be included in plastic covers to receive screws holding the covers together or attaching internal components to the covers. These inserts may be molded in the plastic material when a cover is made, or they may be attached within holes by ultrasonic insertion or by the expansion of the insert as an internal part is moved to hold the insert in place. What is needed is an insert that can be used both to provide a threaded hole to receive a screw and a guiding surface along which a circuit board can move during compression of associated resilient mounting elements.

The patent literature includes a number of examples of resiliently mounted circuit boards within portable electronic devices. For example, Japanese Patent JP5315772 describes a portable electronic device including a circuit board mounted between covers in a manner chosen to prevent the board from cracking due to shock when the device is dropped. In one embodiment, a rubber grommet extends through a hole in the circuit board near its corner, with a bushing extending through a hole in the grommet. A flange of the bushing engages a post forming a portion of the lower cover. A screw extends through a hole in the bushing to hold a post forming a portion of the upper cover against the upper end of the bushing. The grommet includes an upper portion compressed between the post of the upper cover and the circuit board, a lower portion compressed between the post of the lower cover and the circuit board, and a central portion held between the hole within the circuit board and the bushing. In this way, the circuit board is allowed to move in all directions against the resilient surfaces of the grommet. What is needed is a surface limiting such movement in directions parallel to the surfaces of the circuit board.

U.S. Pat. No. 6,399,888 describes a device for buffering and supporting a circuit board, with the device including a lower flexible supporter and an upper buckle head, which is configured to engage a hole of the circuit board, being formed with a number of forked elastic wings to abut against a surface of the circuit board. The flexible supporter has a plate and at least one flexible support portion that is formed, alternatively, by a single integrally formed flexible supporter or a pair of cambered or straight flexible support pieces. Again, what is needed is a structure limiting movement of the circuit board in directions parallel to its surfaces.

U.S. Pat. No. 6,012,041 and U.S. Pat. App. Pub. No. 2002/0149916 describes electronic devices having additional support members placed to extend between circuit boards and housing surfaces, in order to use the structure of the housing to limit the deflection of the circuit board due to impact or vibration. In the device of U.S. Pat. No. 6,012,041, a shock-absorbing member extends between the circuit board, on which a hard disk drive is mounted, and the chassis or housing. In the device of U.S. Pat. App. Pub. No. 2002/0149916, the device includes electrical contact elements that are electrically connected to a plug-in part, having ends in the housing interior that run parallel to each other, protruding toward an opening in the housing, so that the ends pass through contact openings of the circuit board as the circuit board is installed through the opening, being connected conductively to the circuit board. To protect impact-sensitive and vibration-sensitive components, part of the length of the contact elements not inserted into the contact openings is provided with elastically deformable segments, so that the circuit board is flexibly supported in the housing by the contact elements. While such additional support elements extending between the circuit board and the housing reduce deflections of the circuit board caused by the application of shock and vibration to the mass of the circuit board, these supports do not reduce warping of the circuit board caused by the warping of the housing itself as the device is jammed into a confined space with other items.

The patent literature additionally includes a number of descriptions of devices other than circuit boards that are resiliently mounted within portable electronic apparatus. For example, U.S. Pat. No. 6,275,352 describes a disc drive including a plurality of isolation devices that are integrated into a base deck at standard locations for receiving screws, with each of the isolation devices allowing movement of the disc drive at its location in all directions. U.S. Pat. No. 6,115,259 describes a vibration isolating mounting system for tuner elements including grommet-like elements that are deployed within slotted holes in a plate mounting the tuner elements and in the chassis of a television system. Movement is allowed in all directions to isolate the tuner elements from environmental vibrations that could otherwise affect their performance. While such movement is not a problem for disc drives or for the tuner elements, it presents problems when an isolation device is applied to a circuit board to which external connections must be made, or to a circuit board having elements that need to be aligned with features of the housing or cover.

U.S. Pat. No. 6,633,489 describes a method for preventing or minimizing cracking of the ceramic body of a microprocessor processor chip by maintaining the microprocessor chip in a desired relationship with a circuit board while limiting the transmission of shock and vibrating motion to the chip. The microprocessor chip is attached to the circuit board by a dynamic isolating mount that is maintained in a compressed state. However, what is still needed is a method for preventing damage caused by the application of static forces to warp the circuit board as the electronic device including the circuit board is placed in a confined space with other objects.

SUMMARY OF THE INVENTION

According to a first aspect of the invention, apparatus for mounting a circuit board within a housing is provided. The apparatus includes a hole within the circuit board, a pair of spaced apart mounting pads within the housing, a rigid column, and a first resilient spring washer. The rigid column extends through the hole within the circuit board between the mounting pads within the housing. The first resilient spring washer is disposed between a first mounting pad in the spaced apart mounting pads and a first side of the circuit board.

According to another aspect of the invention, apparatus is provided including a first cover having a number of first mounting pads at least one of which includes a screw insert, a second cover having a number of second mounting pads, at least one screw extending through a hole in the number of second mounting pads to engage the screw insert in the number of first mounting pads, a circuit board, and a first resilient spring member. The screw insert has an outward extending portion extending outward from the first mounting pad to an insert end surface having a threaded hole. At least one of the second mounting pads includes a hole aligned with the threaded hole of the screw insert. The screw, extending through the hole in the second mounting pad engages the threaded hole in the screw insert to hold the second mounting surface against the insert end surface. The circuit board extends between the number of first mounting pads and the number of second mounting pads. The circuit board includes at least one mounting hole extending around the outward extending portion of a screw insert. The first resilient spring member extends around the outward extending portion of a screw insert.

Preferably, the apparatus additionally includes a second resilient spring member extending around the portion of a screw insert between a mounting pad and a second surface of the circuit board, opposite the first surface thereof. Each of the spring members may include a Bellville spring washer, a wave spring washer, a helical spring coil, or an elastomeric pad. Preferably, a surface of the mounting hole within the circuit board slides on the outward extending portion of the screw insert. Alternately, both of the resilient spring members may be elastomeric pads forming portions of a grommet extending through the mounting hole in the circuit board.

DETAILED DESCRIPTION OF THE INVENTION

Figure 1:
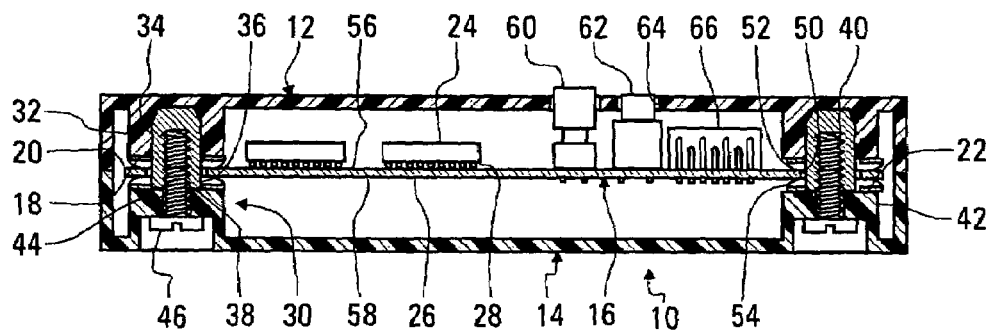
FIG. 1 is a cross-sectional view of a portable electronic device built in accordance with the invention.

FIG. 1 is a cross-sectional view of a portable electronic device 10 built in accordance with the invention. The portable electronic device 10 includes a housing 11 including a first cover 12, a second cover 14, together with a circuit board 16 held between the covers 12, 14. For example, the first cover 12 includes four first mounting surfaces 18, located adjacent the four corners 20 of the rectangular circuit board 16, while the second cover 14 includes four second mounting surfaces 22 located adjacent the four first mounting surfaces 18. The circuit board 16 includes a number of circuit modules 24 having electrical and mechanical connections to the underlying circuit card 26, such as solder balls 28, which may be broken by flexure of the circuit card 26. The covers 12, 14 may be flexed into a warped condition by placing the portable electronic device 10 in a confined space with other objects. For example, the portable electronic device 10 may be a laptop computer used by a student and squeezed into a backpack with a number of other items. In order to prevent damage to the circuit board 16, and particularly to connections such as the solder balls 28 between components 24 and the circuit card 26, by warping the covers 12,14, the circuit board is resiliently mounted between the first mounting surfaces 18 of the first cover 12 and the second cover 14 by four mounting structures 30.

Figure 2:
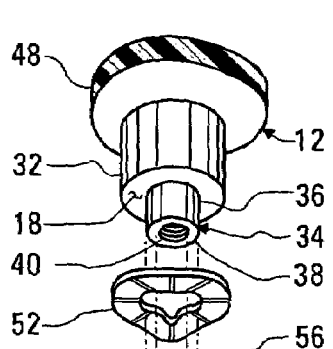
FIG. 2 is a fragmentary perspective view of the device of FIG. 1, showing elements mounting a circuit board therein in an exploded relationship.

FIG. 2 is a fragmentary perspective view of the electronic device 10, showing various elements used to mount the circuit board 16 in an exploded relationship with one another. The first cover 12 includes a mounting post 32 having a screw insert 34 with an outward extending portion 36 extending outward from the first mounting surface 18 to an insert end surface 38. A threaded hole 40 extends inward, within the screw insert 34 from the insert end surface 38. The second cover 14 includes a mounting post 42 through which a hole 44 extends, being aligned with the threaded hole 40. A mounting screw 46 extends through the hole 44, engaging the threaded hole 40 to hold the insert end surface 38 against the second mounting surface 22 of the mounting post 42.

For example, the main structure 48 of first cover 12 is composed of a thermoplastic resin, while the screw insert 34 is composed of metal, being attached to the main structure 48 by means well understood by those skilled in the art of making such covers. For example, the screw insert 34 may be inserted within a mating hole within the mounting post 32 by heat staking, with the insert being heated before it is inserted within the thermoplastic material of the cover, or by ultrasonic insertion. Alternately, the screw insert 34 may be loaded into a mold used to form the first cover 12 before the thermoplastic resin is inserted into the mold to form the main structure 48. Grooves or another surface texture may be applied to the insert before it is inserted to held hold it in place after insertion.

The circuit board 16 includes a mounting hole 50, extending around the outward extending portion 36 of the screw insert 34. A first resilient spring member 52 and a second resilient spring member 54 also extend around the outward extending portion 36, with the first resilient spring member 52 being disposed between a first surface 56 of the circuit board 16 and the first mounting surface 16, and with the second resilient spring member 54 being disposed between a second surface 58 of the circuit board 16, opposite the first surface thereof, and the second mounting surface 22.

In general, the resilient spring members 52, 54 are all placed in compression when the screws 46 are tightened. When the covers 12, 14 are warped, the application of warping strains to the circuit board 16 is limited, since the circuit board has an ability to resist warping while various resilient spring members 52, 54 are additionally compressed, and while the levels of compression of other resilient spring members 52, 54 are reduced. Furthermore, if the circuit board 16 is warped during the process of its manufacture, the warping stresses induced within the circuit board 16 as it is fastened between covers 12, 14 that are not warped are reduced, with the circuit board 15 being allowed to remain in a warped condition due to changes in the level of compression of various of the resilient spring members 52, 54. This reduction in warping stresses that can be produced within the circuit board 16 after its manufacture reduces the stresses placed on circuit lands within the circuit board 16, and especially on the connections, such as the solder balls 28 to components 24 forming parts of the circuit board 16.

The circuit board 16 may additionally include a number of components that need to be aligned with features within the covers 12, 14, such as a pushbutton 60 and an indicator light 62, which must be aligned with apertures 64 in the first cover 12. Furthermore, the circuit board 16 may include one or more connectors 66 that are aligned with apertures (not shown) within the covers 12, 14 and that are subjected to the application of external forces as external devices are attached to the connectors 66 or removed therefrom. Therefore, it is particularly desirable to limit the movement of the circuit board 16 in all directions parallel to its surface 56 while allowing movement of the circuit board 16 in directions perpendicular to its surface 56. Limiting this movement in directions parallel to the surface 56 retains the locations of components on the circuit board relative to features of the covers 12, 14, such as the apertures 64 and prevents a "spongy" feel during the insertion or removal of an external device from a connector 66 attached to the circuit board 16. For example, the electronic device 10 may be representative of a portable computer system used by a student and squeezed into a backpack with a number of other items, warping the covers.

In accordance with a preferred version of the present invention, movement of the circuit board 16 in directions parallel to its surface 56 is limited by making the mounting holes 50 in the circuit board 16 only slightly larger than the outward extending portions 36 of the screw inserts 34, and by providing for the surfaces of these mounting holes 50 to slide along the surfaces of these portions 36.

Figure 3:
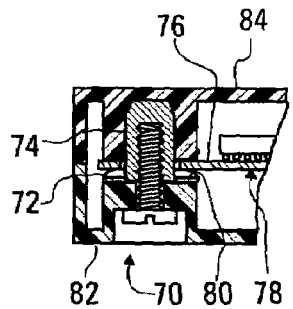
FIG. 3 is a fragmentary cross-sectional view of a portable electronic device built in accordance with a first alternative embodiment of the invention.

FIG. 3 is a fragmentary cross-sectional view of a portable electronic device 70 built in accordance with a first alternative embodiment of the invention to include only one resilient spring member 72 extending around the screw insert 74, compressed between a surface 76 of the circuit board 78 and a mounting surface 80 of one of the covers 82. The single resilient spring member 72 may be between the circuit board 78 and the cover 82, as shown, or between the circuit board 78 and the other cover 84, from which the screw insert 74 extends. Other aspects of the portable electronic device 70 are similar to those of the first embodiment device 10, as described above in reference to FIGS. 1 and 2.

Figure 4:
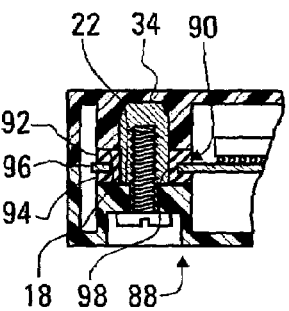
FIG. 4 is a fragmentary cross-sectional view of a portable electronic device built in accordance with a second alternative embodiment of the invention.

FIG. 4 is a fragmentary cross-sectional view of a portable electronic device 88 built in accordance with a second alternative embodiment of the invention to a grommet 90 extending between the first mounting surface 18 of the first cover 12 and the second mounting surface 22 of the second cover 14. The grommet 90 includes an elastomeric pad forming a first resilient spring member 92, a second elastomeric pad forming a second resilient spring member 94, and an elastomeric core 96 extending between the first resilient spring member 92 and the second resilient spring member 94. While the surfaces of the circuit board mounting holes 98 do not slide on the protruding portion 36 of the screw insert 34, as described in reference to electronic device 10 built in accordance with the first embodiment of the invention, other aspects of the portable electronic device 88 are as described above in reference to FIGS. 1 and 2.

In the examples of FIGS. 1-3, the resilient spring members 52, 54, 72 are wave spring washers, having undulations 100 extending in the directions of arrow 102, angularly spaced around the spring washers, with the undulations 100 being progressively flattened as the circuit board 16 is moved toward an adjacent mounting surface.

Figure 5:
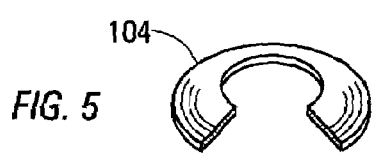
FIG. 5 is a fragmentary perspective view of a first alternative version of a resilient spring member for use within the devices of FIGS. 1-3.

FIG. 5 is a fragmentary perspective view of a first alternative version of a spring washer 104 that can be used in place of the resilient spring members 52, 54, 72 in the devices of FIGS. 1-3. The spring washer 104 is a Bellville spring washer having a truncoconical profile. One section of the spring washer 104 is shown as removed to clarify its shape.

Figure 6:
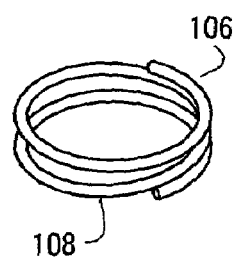
FIG. 6 is a perspective view of a second alternative version of a resilient spring member for use within the devices of FIGS. 1-3.

FIG. 6 is a perspective view of resilient spring member 106, including a helical spring portion 108, that can be used in place of the resilient spring members 52, 54, 72 in the devices of FIGS. 1-3.

While the invention has been described and shown in its preferred forms or embodiments with some degree of particularity, it is understood that this description has been given only by way of example, and that many variations can be achieved without departing from the spirit and scope of the invention, as defined in the appended claims.

What is claimed is:

1. Apparatus for mounting a circuit board within a housing, to be disposed between first and second covers of the housing, wherein the apparatus comprises:
    a mounting hole within the circuit board;
    a first mounting pad forming a portion of the first cover within the housing;
    a second mounting pad, spaced apart from the first mounting pad, forming a portion of the second cover within the housing;
    a rigid column extending through the mounting hole within the circuit board between the first and second mounting pads, and
    a first resilient spring washer disposed between the first mounting pad and a first side of the circuit board; and a second resilient spring washer disposed between the second mounting pad and a second side, opposite the first side, of the circuit board, wherein a surface of the mounting hole within the circuit board slides along the rigid column with changes in levels of compression within the first and second resilient spring washers.

2. The apparatus of claim 1, wherein the resilient spring washers include a wave washer.

3. The apparatus of claim 1, wherein the resilient spring washers include a Bellville washer.

4. The apparatus of claim 1, wherein
the rigid column includes a screw insert extending from the first mounting pad, and
the apparatus additionally includes a screw extending through the second mounting pad to engage the screw insert.

5. The apparatus of claim 4, wherein the screw insert engages the second mounting pad, maintaining a space between the pair of spaced apart mounting pads.

6. The apparatus of claim 1, wherein the rigid column extends from the first mounting pad to engage the second mounting pad, maintaining a space between the pair of spaced apart mounting pads.

7. Apparatus for mounting a circuit board within a housing, to be disposed between first and second covers of the housing, wherein the apparatus comprises:
a plurality of mounting holes within the circuit board;
a plurality of pairs of spaced apart mounting pads within the housing, wherein each pair of spaced apart mounting pads in the plurality of pairs of spaced apart mounting pads includes a first mounting pad forming a portion of the first cover and a second mounting pad forming a portion of the second cover;
a plurality of rigid columns, wherein each of the rigid columns extends through a mounting hole within the plurality of mounting holes and between the first and second mounting pads within a pair of spaced apart mounting pads within the plurality of pairs of spaced apart mounting pads; and
a first resilient spring washer disposed between the first mounting pad in each pair of spaced apart mounting pads in the plurality of pairs of spaced apart mounting pads and a first side of the circuit board; and
a second resilient spring washer disposed between the second mounting pad in each pair of spaced apart mounting pads in the plurality of mounting pads and a second side, opposite the first side, of the circuit board, wherein a surface of each of the mounting holes within the circuit board slides along the rigid column extending through the mounting hole with changes in levels of compression within the first and second resilient spring washers adjacent the mounting hole.

8. The apparatus of claim 7, wherein
each of the rigid columns includes a screw insert extending from the first mounting pad, and
the apparatus additionally includes a plurality of screws extending through the second mounting pad in each pair of spaced apart mounting pads within the plurality of pairs of spaced apart mounting pads to engage the screw insert.

9. The apparatus of claim 8, wherein the screw insert engages the second mounting pad in the pair of spaced apart mounting pads, maintaining the space between the pair of spaced apart mounting pads.

10. The apparatus of claim 7, wherein each of the rigid columns extends from the first mounting pad in the pair of spaced apart mounting pads, maintaining the space between the pair of spaced apart mounting pads.

11. Apparatus comprising:
a first cover including a plurality of mounting first mounting pads, wherein at least one of the first mounting pads includes a screw insert having an outward extending portion extending outward from the first mounting pad to an insert end surface and having a threaded hole;
a second cover including a plurality of second mounting pads, wherein at least one of the second mounting pads includes a hole aligned with the threaded hole of the screw insert of at least one of the first mounting pads;
at least one screw extending through a hole in the plurality of second mounting pads, engaging a threaded hole in the plurality of first mounting pads to hold the second mounting pad against the insert end surface;
a circuit board extending between the plurality of first mounting pads and the plurality of second mounting pads, wherein the circuit board includes at least one mounting hole extending around the outward extending portion of a screw insert; and
a first resilient spring member extending around the outward extending portion of a screw insert and between a mounting pad and a first surface of the circuit board; and
a second resilient spring member extending around the portion of a screw insert between a mounting pad and a second surface of the circuit board, wherein a surface of the mounting hole within the circuit board slides along the outward extending portion of the screw insert with changes in levels of compression within the first and second resilient spring washers.

12. The apparatus of claim 11, wherein one of the resilient spring members includes a wave spring washer.

13. The apparatus of claim 11, wherein one of the resilient spring members includes a Bellville spring washer.

14. The apparatus of claim 11, wherein one of the resilient spring members includes an elastomeric pad.

15. The apparatus of claim 14, wherein both of the resilient spring members include elastomeric pads forming portions of a grommet extending through the mounting hole of the circuit board.

16. The apparatus of claim 11, wherein one of the resilient spring members includes a helical spring.

* * * * *